(12) United States Patent
Fueldner et al.

(10) Patent No.: US 11,932,533 B2
(45) Date of Patent: Mar. 19, 2024

(54) SIGNAL PROCESSING CIRCUIT FOR TRIPLE-MEMBRANE MEMS DEVICE

(71) Applicant: Infineon Technologies AG, Neubiberg (DE)

(72) Inventors: Marc Fueldner, Neubiberg (DE); Andreas Wiesbauer, Poertschach (AT); Athanasios Kollias, Munich (DE)

(73) Assignee: Infineon Technologies AG, Neubiberg (DE)

( * ) Notice: Subject to any disclaimer, the term of this patent is extended or adjusted under 35 U.S.C. 154(b) by 386 days.

(21) Appl. No.: 17/128,638

(22) Filed: Dec. 21, 2020

(65) Prior Publication Data

US 2022/0194784 A1   Jun. 23, 2022

(51) Int. Cl.
*B81C 1/00* (2006.01)
*B81B 7/02* (2006.01)

(52) U.S. Cl.
CPC ........... *B81C 1/0023* (2013.01); *B81B 7/02* (2013.01); *B81C 1/00158* (2013.01); *B81C 1/00182* (2013.01); *B81C 1/00293* (2013.01); *B81B 2201/0257* (2013.01); *B81B 2203/0127* (2013.01); *B81B 2207/012* (2013.01); *B81B 2207/03* (2013.01); *B81C 2201/0174* (2013.01); *B81C 2203/0792* (2013.01)

(58) Field of Classification Search
None
See application file for complete search history.

(56) References Cited

U.S. PATENT DOCUMENTS

| | | | |
|---|---|---|---|
| 6,075,867 | A | 6/2000 | Bay et al. |
| 9,181,080 | B2 | 11/2015 | Dehe et al. |
| 9,438,979 | B2 | 9/2016 | Dehe |
| 9,828,237 | B2 | 11/2017 | Walther et al. |
| 9,986,344 | B2 | 5/2018 | Dehe et al. |
| 10,189,699 | B2 | 1/2019 | Walther et al. |
| 2015/0001647 | A1 | 1/2015 | Dehe et al. |
| 2017/0230757 | A1 | 8/2017 | Kuntzman et al. |
| 2017/0260040 | A1 | 9/2017 | Walther et al. |
| 2018/0091906 | A1* | 3/2018 | Khenkin ............... H04R 19/04 |
| 2018/0255402 | A1* | 9/2018 | Dehe ..................... H04R 19/04 |
| 2019/0039884 | A1 | 2/2019 | Dehe et al. |

* cited by examiner

Primary Examiner — Walter F Briney, III
(74) Attorney, Agent, or Firm — Slater Matsil, LLP

(57) ABSTRACT

A triple-membrane MEMS device includes a first membrane, a second membrane and a third membrane spaced apart from one another, wherein the second membrane is between the first membrane and the third membrane, a sealed low pressure chamber between the first membrane and the third membrane, a first stator and a second stator in the sealed low pressure chamber, and a signal processing circuit configured to read-out output signals of the triple-membrane MEMS device.

17 Claims, 12 Drawing Sheets

SIGNAL PROCESSING CIRCUIT FOR TRIPLE-MEMBRANE MEMS DEVICE

TECHNICAL FIELD

The present invention relates generally to a signal processing circuit configured to read-out output signals of a triple-membrane MEMS device.

BACKGROUND

A microphone is an acoustic sensor converting an acoustic pressure wave to an electric signal. The microphone includes a microelectromechanical system (MEMS) sensor and an application specific integrated circuit (ASIC). The MEMS sensor and the ASIC are disposed in a single package. The MEMS sensor and the ASIC are connected together through suitable electrical connections.

The MEMS sensor functions as a variable capacitor having a fixed plate and a movable plate. The movable plate is also known as a membrane. When an acoustic pressure wave is applied to the MEMS sensor, the membrane is able to move in response to the acoustic pressure wave. The movement of the membrane relative to the fixed plate varies the distance between the membrane and the fixed plate of the variable capacitor, which in turn varies the capacitance of the variable capacitor. The variation of the capacitance is determined by various parameters of the acoustic pressure wave such as sound pressure levels of the acoustic pressure wave. The variation of the capacitance of the MEMS sensor is converted into an analog signal, which is fed into the ASIC for further processing.

As semiconductor technologies further advance, a sealed dual-membrane MEMS silicon microphone has emerged to further improve key performance characteristics such as low noise and reliability. The sealed dual-membrane MEMS silicon microphone typically includes a top membrane, a bottom membrane, a perforated stator, a top isolation layer between the peripheral portions of the top membrane and the stator, a bottom isolation layer between the peripheral portions of the bottom membrane and the stator, and at least one pillar coupled between the top membrane and the bottom membrane.

The sealed dual-membrane MEMS silicon microphone is good for reducing noise. But there is still ASIC noise. More capacitance is helpful to further reduce the ASIC noise. There is a need to increase the capacitance of the MEMS silicon microphone so as to meet the requirements of the ever-changing MEMS microphone.

SUMMARY

In accordance with an embodiment, a method of reading-out a microelectromechanical system (MEMS) device, the MEMS device comprising a first membrane, a second membrane and a third membrane spaced apart from one another, the second membrane being between the first membrane and the third membrane, a first stator between the first membrane and a second membrane, and a second stator between a second membrane and a third membrane, the method comprises forming a first capacitor between the first membrane and the first stator, a second capacitor between the first stator and the second membrane, a third capacitor between the second membrane and the second stator, and a fourth capacitor between the second stator and the third membrane, and configuring the first capacitor, the second capacitor, the third capacitor and the fourth capacitor in a series configuration to increase motor sensitivity of the MEMS device or in a parallel configuration to reduce an output impedance of the MEMS device.

In accordance with another embodiment, a triple-membrane MEMS device comprises a first membrane, a second membrane and a third membrane spaced apart from one another, wherein the second membrane is between the first membrane and the third membrane, a sealed low pressure chamber between the first membrane and the third membrane, a first stator and a second stator in the sealed low pressure chamber, and a signal processing circuit configured to read-out output signals of the triple-membrane MEMS device.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a signal processing circuit configured to read-out output signals of a triple-membrane MEMS device. The signal processing circuit of the present disclosure may also be applied, however, to a variety of MEMS devices. Hereinafter, various embodiments will be explained in detail with reference to the accompanying drawings.

Figure 1:
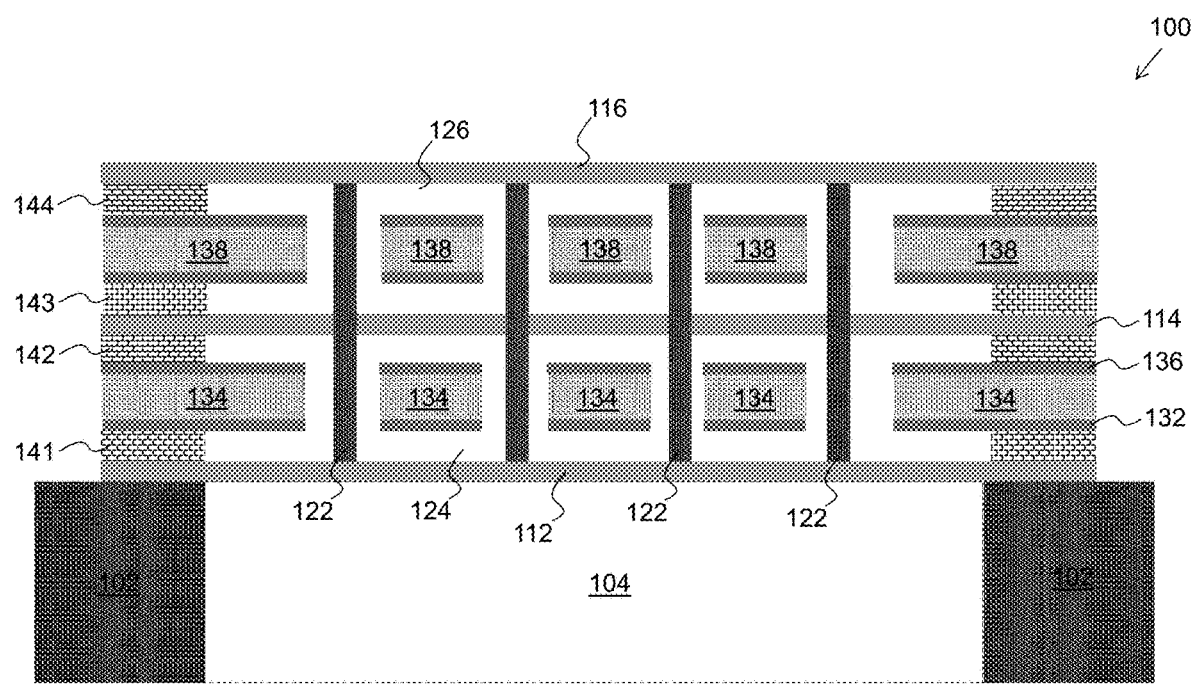
FIG. 1 illustrates a cross sectional view of a triple-membrane MEMS microphone in accordance with various embodiments of the present disclosure.

FIG. 1 illustrates a cross sectional view of a triple-membrane MEMS microphone in accordance with various embodiments of the present disclosure. The triple-membrane MEMS microphone 100 comprises a first membrane 112, a second membrane 114 and a third membrane 116 spaced apart from one another. As shown in FIG. 1, the second membrane 114 is between the first membrane 112 and the third membrane 116. In some embodiments, the first membrane 112, the second membrane 114 and the third membrane 116 may be formed of conductive materials. Furthermore, the first membrane 112, the second membrane 114 and the third membrane 116 are movable membranes.

The triple-membrane MEMS microphone 100 further comprise a first low pressure region 124, a second low pressure region 126, a plurality of pillars 122 and a plurality of first stators 134 and a plurality of second stators 138. As shown in FIG. 1, the first low pressure region 124 is between the first membrane 112 and the second membrane 114. The second low pressure region 126 is between the second membrane 114 and third second membrane 116. The plurality of first stators 134 is in the first low pressure region 124. The plurality of second stators 138 is in the second low pressure region 126. It should be noted that the plurality of first stators 134 shown in FIG. 1 may be from a single stator plane having a plurality of openings. As such, the plurality of first stators 134 may be alternatively referred to as a first stator 134. Likewise, the plurality of second stators 138 shown in FIG. 1 may be from another single stator plane having a plurality of openings. As such, the plurality of second stators 138 may be alternatively referred to as a second stator 138.

The triple-membrane MEMS microphone 100 is formed over a support substrate 102. As shown in FIG. 1, the peripheral portions of the first membrane 112 are on the support substrate 102. A backside cavity 104 may be formed in the support substrate 102. The backside cavity 104 is employed to allow the first membrane 112 to oscillate in response to a sound wave. According to various embodiments, the backside cavity 104 may formed in the support substrate 102 through various etching techniques such as isotropic gas phase etching, vapor etching, wet etching, isotropic dry etching, plasma etching, any combinations thereof and the like.

In some embodiments, the support substrate 102 may be a silicon substrate. Alternatively, the support substrate 102 may be formed of any suitable semiconductor materials. For example, the support substrate 102 may be formed of semiconductor materials such as germanium, silicon germanium, silicon carbide, gallium nitride, indium, indium gallium nitride, indium gallium arsenide, indium gallium zinc oxide, any combinations thereof and the like. Furthermore, the support substrate 102 may be formed of suitable compound semiconductor materials such as III-V compound semiconductor materials and/or II-VI compound semiconductor materials.

As shown in FIG. 1, the first membrane 112 and the third membrane 116 form a chamber. In some embodiments, the chamber is a sealed chamber. The chamber includes the first low pressure region 124 and the second low pressure region 126. The pressure inside the chamber is lower than the pressure outside the chamber. In other words, the first low pressure region and the second low pressure region have a pressure less than an outer pressure. In some embodiments, the outer pressure is a pressure outside the membranes (outside the chamber). The outer pressure is equal to an atmospheric pressure or an ambient pressure.

In some embodiments, the pressure inside the chamber may be a vacuum. In some embodiments, the pressure in the first low pressure region 124 may be different from that of the second low pressure region 126. In alternative embodiments, the second membrane 114 may have a plurality of openings. As a result of having the plurality of openings in the second membrane 114, the pressure in the first low pressure region 124 is equal to the pressure of the second low pressure region 126.

As shown in FIG. 1, each stator (e.g., first stator 134) may comprise a first counter electrode element 132 and a second counter electrode element 136. The second counter electrode element 136 may be spaced apart from the first counter electrode element 132. More particularly, a counter electrode isolating layer is formed between the first counter electrode element 132 and the second counter electrode element 136. In some embodiments, the counter electrode isolating layer may be formed of suitable dielectric materials such as a silicon oxide, a silicon nitride and the like.

In some embodiments, the first counter electrode element 132 and the second counter electrode element 136 may be formed of various metals such as copper, aluminum, silver, nickel, and various suitable alloys. Alternatively, the first counter electrode element 132 and the second counter electrode element 136 may be formed of various semiconductor materials which may be doped such that they are electrically conductive (e.g., a polysilicon layer heavily doped with boron, phosphorus, or arsenic).

As shown in FIG. 1, the first stator 134 is at least partially arranged in the first low pressure region 124 or extends in the first low pressure region 124. Likewise, the second stator 138 is at least partially arranged in the second low pressure region 126 or extends in the second low pressure region 126.

FIG. 1 shows some portions of the stators may be supported at its periphery or circumference by a support structure (e.g., membrane isolation layers 141-144). FIG. 1 also shows some portions of the stators appear to be "floating" within the low pressure regions 124 and 126. It should be noted that the "floating" portions of the stators may be typically attached to the circumference of the stators.

The plurality of pillars 122 extends between the first membrane 112 and the third membrane 116. More particularly, a first terminal of each pillar extends through the first membrane 112. A second terminal of each pillar extends through the third membrane 116. In some embodiments, one or more pillars are electrically conductive. The conductive pillar provides a mechanical and electrical coupling between at least two membranes. In alternative embodiments, the pillars are electrically insulating. The non-conductive pillars provide a mechanical coupling between at least two membranes.

The plurality of pillars 122 is mechanically coupled to the first membrane 112, the second membrane 114 and the third membrane 116. As shown in FIG. 1, the pillars 122 typically do not contact or touch the first stator 134 and the second stator 138. The pillars 122 may pass through the stators 134 and 138 through openings or holes in the stators 134 and 138.

In the process of fabricating the triple-membrane MEMS microphone 100, the pillars 122 may be integrally formed with the first membrane 112, the second membrane 114 and the third membrane 116. Hence, the first membrane 112, the second membrane 114, the third membrane 116, and the pillars 122 may form an integral structure of the same material such as polycrystalline silicon and the like. Alternatively, the membranes 112, 114, 116 and the pillars 122 may be formed of different materials. For example, the first membrane 112 may be formed first on a surface of the support substrate 102 during a first deposition process. Subsequently, the pillars 122 and eventually also the other membranes 114 and 116 may be formed during subsequent deposition processes. In some embodiments, the pillars 122, which ensure a mechanical coupling among the membranes, do not provide an electrical connection between the two membranes. The pillars 122 can be made of an insulating material, like silicon, nitride, silicon oxide, a polymer or a combination of the former materials, or a combination of the former material.

The support structure of the triple-membrane MEMS microphone 100 may have a stacked configuration. The support structure of the triple-membrane MEMS microphone 100 includes the support substrate 102, a first membrane isolation layer 141, a second membrane isolation layer 142, a third membrane isolation layer 143 and a fourth membrane isolation layer 144. In some embodiments, the peripheral portions of the membranes 112, 114 and 116, and the stators 134, 138 may be in contact with the support structure as shown in FIG. 1. In particular, FIG. 1 shows the various membrane isolation layers of the support structure and the membranes may be arranged on top of each other in the following order, for example: the first membrane 112, the first membrane isolation layer 141, the first counter electrode element of the first stator 134, the counter electrode isolating layer of the first stator 134, the second counter electrode element of the first stator 134, the second membrane isolation layer 142, the second membrane 114, the third membrane isolation layer 143, the first counter electrode element of the second stator 138, the counter electrode isolating layer of the second stator 138, the second counter electrode element of the second stator 138, the fourth membrane isolation layer 144 and the third membrane 16.

It should be noted that while FIG. 1 shows the membrane isolation layer (e.g., the first membrane isolation layer 141) is of a vertical sidewall, for achieving high robustness, the membrane isolation layer may be a tapered sidewall. For example, the first membrane isolation layer 141 may be of a tapered sidewall oriented in a first direction. The second membrane isolation layer 142 may be of a tapered sidewall oriented in a second direction. The first direction and the second direction are opposite to each other.

After having the support structure shown in FIG. 1, each membrane (e.g., first membrane 112) comprises a movable portion and a fixed portion. The fixed portion of the first membrane 112 is, for example, mechanically connected to the support substrate 102 and the first membrane isolation layer 141.

FIG. 1 shows the triple-membrane MEMS microphone 100 at its rest position, e.g. when no sound wave arrives at the membranes. The sound wave could cause the membranes 112, 114 and 116 to be deflected. As shown in FIG. 1, the third membrane 116 may be exposed to an ambient pressure and potentially a sound pressure. This top side of the third membrane 116 may also be regarded as a sound receiving main surface of the triple-membrane MEMS microphone 100.

In some embodiments, when sound waves are incident on the membranes (e.g., the top side of the third membrane 116), the membranes may deflect and/or oscillate. A displacement of one membrane (e.g., the third membrane 116) may result in the corresponding displacements of the second membrane 114 and the first membrane 112 if they are mechanically coupled to each other. The third membrane 116 may deflect in a direction substantially toward the second stator 138 while the second membrane 114 may simultaneously be deflected in substantially the same direction as the third membrane 116 and therefore may move away from the second stator 138. Likewise, the second membrane 114 may deflect in a direction substantially toward the first stator 134 while the first membrane 112 may simultaneously be deflected in substantially the same direction as the second membrane 114 and therefore may move away from the first stator 134.

In some embodiments, the top side of the third membrane 116 at which the sound may arrive, the total pressure may be equal to the sum of the normal pressure (e.g., the atmospheric pressure) and the sound pressure. Within the backside cavity 104, only the normal atmospheric pressure may be present.

In some embodiments, the first membrane 112 and the first stator 134 form a first capacitor. The first stator 134 and the second membrane 114 form a second capacitor. The second membrane 114 and the second stator 138 form a third capacitor. The second stator 138 and the third membrane 116 form a fourth capacitor.

In operation, the capacitance variations of the four capacitors are observed. A first capacitance variation is based on the first capacitor, which is formed between the first membrane 112 and the first stator 134. A second capacitance variation is based on the second capacitor, which is formed between the first stator 134 and the second membrane 116.

A third capacitance variation is based on the third capacitor, which is formed between the second membrane 114 and the second stator 138. A fourth capacitance variation is based on the fourth capacitor, which is formed between the second stator 138 and the third membrane 116. The capacitances of these four capacitors vary in relation to the movement of the movable portions of the first, second and third membranes 112, 114 and 116 with respect to the stators 134 and 138. The movement of the movable portions of the membranes 112, 114 and 116 is generated by, for example, sound pressure changes caused by speech, music and the like.

Figure 2:
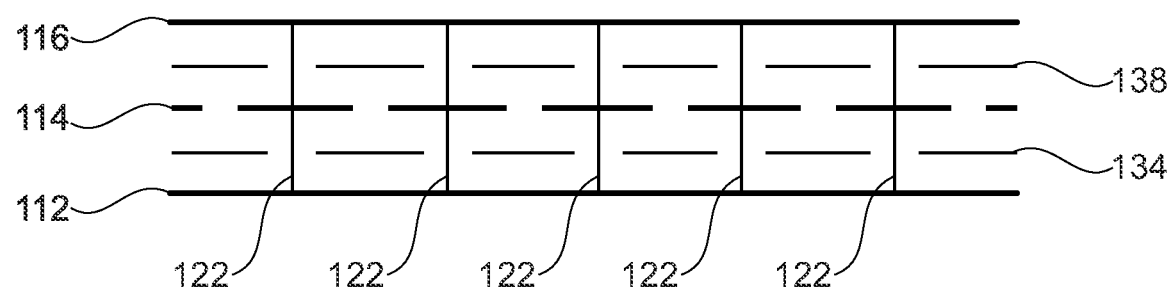
FIG. 2 illustrates a simplified view of the triple-membrane MEMS microphone shown in FIG. 1 in accordance with various embodiments of the present disclosure.

FIG. 2 illustrates a simplified view of the triple-membrane MEMS microphone shown in FIG. 1 in accordance with various embodiments of the present disclosure. The triple-membrane MEMS microphone comprises a first membrane 112, a second membrane 114 and a third membrane 114 spaced apart from one another. As shown in FIG. 2, the second membrane 114 is between the first membrane 112 and the third membrane 114. In some embodiments, a sealed low pressure chamber is formed between the first membrane 112 and the third membrane 116. A first stator 134 and a second stator 138 are in the sealed low pressure chamber.

In some embodiments, a first capacitor is formed between the first membrane 112 and the first stator 134. A second capacitor is formed between the first stator 134 and the second membrane 114. A third capacitor is formed between the second membrane 114 and the second stator 138. A fourth capacitor is formed between the second stator 138 and the third membrane 116. When a plurality of bias voltages is applied to the capacitors, and sound waves cause the membranes 112, 114 and 116 to move, the sound waves can be converted into useable electrical signals by measuring the capacitance changes caused by the movement of the membranes relative to the stators. A signal processing circuit is coupled to the triple-membrane MEMS microphone. The signal processing circuit is configured to read-out the useable electrical signals generated by the triple-membrane MEMS microphone. The signal processing circuit will be discussed in detail below with respect to FIG. 4-11.

Figure 3:
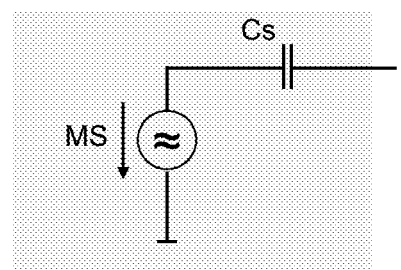
FIG. 3 illustrates an equivalent source model of a single MEMS element of the triple-membrane MEMS microphone in accordance with various embodiments of the present disclosure.

FIG. 3 illustrates an equivalent source model of a single MEMS element of the triple-membrane MEMS microphone in accordance with various embodiments of the present disclosure. The circuit shown in FIG. 3 represents an AC equivalent circuit of a single MEMS element such as one capacitor of the four capacitors described above with respect to FIG. 2. In the equivalent circuit, MS is the motor sensitivity of the MEMS element. Cs is the source capacitance of the MEMS element.

The four capacitors described above may be arranged in a series configuration to reach the highest sensitivity and the lowest output capacitance. In such an arrangement, the motor sensitivity of the triple-membrane MEMS microphone is equal to four times the motor sensitivity of the single MEMS element. The output capacitance of the triple-membrane MEMS microphone is equal to one fourth of the output capacitance of the single MEMS element. On the other hand, the four capacitors described above may be arranged in a parallel configuration to reach the lowest sensitivity and the highest output capacitance. In such an arrangement, the motor sensitivity of the triple-membrane MEMS microphone is equal to the motor sensitivity of the single MEMS element. The output capacitance of the triple-membrane MEMS microphone is equal to four times the output capacitance of the single MEMS element. In other words, the first capacitor, the second capacitor, the third capacitor and the fourth capacitor are configured in a series configuration to increase motor sensitivity of the MEMS device or in a parallel configuration to reduce an output impedance of the MEMS device. The detailed configurations of these four capacitors will be described below with respect to FIGS. 4-11.

Figure 4:
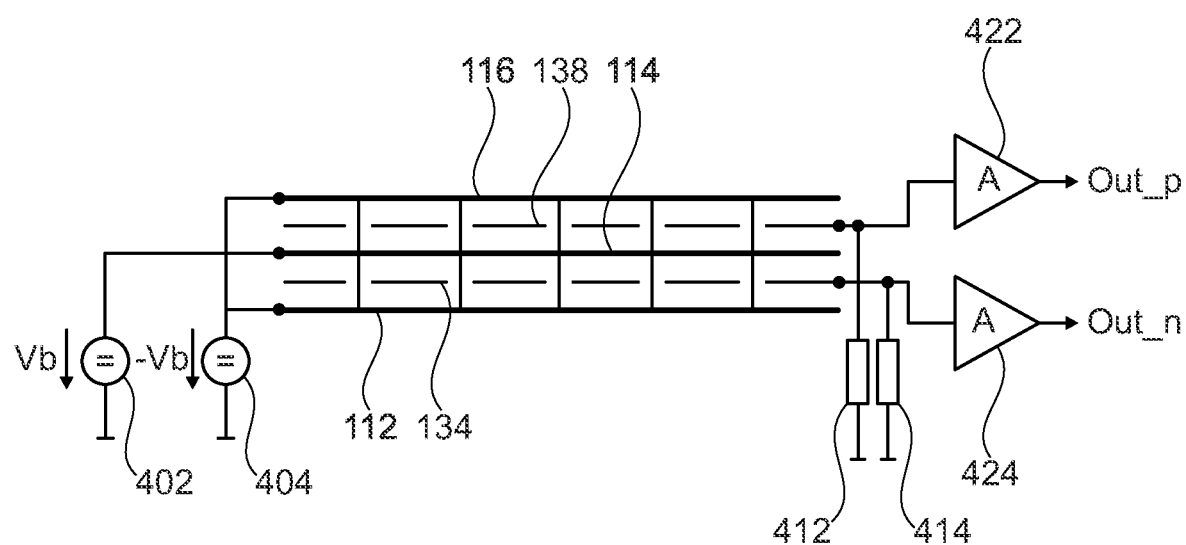
FIG. 4 illustrates a schematic diagram of a first read-out operating mode of the triple-membrane MEMS microphone in accordance with various embodiments of the present disclosure.

FIG. 4 illustrates a schematic diagram of a first read-out operating mode of the triple-membrane MEMS microphone in accordance with various embodiments of the present disclosure. As shown in FIG. 4, the signal processing circuit of the first read-out operating mode comprises a first bias voltage source 402, a second bias voltage source 404, a first resistor 412, a second resistor 414, a first amplifier 422 and a second amplifier 424. The first bias voltage source 402 is a positive voltage source configured to produce a positive bias voltage. In some embodiments, the output voltage (Vb) of the first bias voltage source 402 is in a range from about 5 V to about 15 V. The second bias voltage source 404 is a negative voltage source configured to produce a negative bias voltage. In some embodiments, the output voltage (−Vb) of the second bias voltage source 404 is in a range from about −5 V to about −15 V.

It should be noted the voltage sources shown in FIG. 4 are merely an example. Depending on different applications and design needs, the voltage sources throughout the description may be implemented as a filtered voltage source. In other words, a filter such as a resistor-capacitor (RC) filter may be connected to the output of the voltage source. Furthermore, a voltage source may be indirectly coupled to a circuit to be powered by the voltage source. For example, a large resistor may be coupled between the output of a voltage source and a filter. The large resistor provides a high ohmic connection between the voltage source and the circuit to be powered by the voltage source.

As shown in FIG. 4, the second bias voltage source 404 is configured to bias the first membrane 112 and the third membrane 116. The first bias voltage source 402 is configured to bias the second membrane 114.

The first amplifier 422 is connected to the second stator 138. The first amplifier 422 is configured to read-out a positive output signal (Out_p) of the triple-membrane MEMS microphone. The first resistor 412 is coupled between the input of the first amplifier 422 and a first predetermined voltage potential. In some embodiments, the first resistor 412 is a 100 Giga-ohm resistor. The first predetermined voltage potential is equal to zero. Alternatively, depending on different applications and design needs, the first predetermined voltage potential may be any suitable voltage levels such as a voltage level in a range from about 0.1V to about 1 V.

The second amplifier 424 is connected to the first stator 134. The second amplifier 424 is configured to read-out a negative output signal (Out_n) of the triple-membrane MEMS microphone. The second resistor 414 is coupled between the input of the second amplifier 424 and a second predetermined voltage potential. In some embodiments, the second resistor 414 is a 100 Giga-ohm resistor. The second predetermined voltage potential is equal to zero. Alternatively, depending on different applications and design needs, the second predetermined voltage potential may be any suitable voltage levels such as a voltage level in a range from about 0.1V to about 1V.

In the triple-membrane MEMS microphone, a first capacitor is formed between the first membrane 112 and the first stator 134. A second capacitor is formed between the first stator 134 and the second membrane 114. A third capacitor is formed between the second membrane 114 and the second stator 138. A fourth capacitor is formed between the second stator 138 and the third membrane 116.

In the first read-out operating mode, the first capacitor and the second capacitor are configured to be connected in parallel through the first bias voltage source 402 and the second bias voltage source 404. The third capacitor and the fourth capacitor are configured to be connected in parallel through the first bias voltage source 402 and the second bias voltage source 404.

The arrangement of the four capacitor of FIG. 4 forms a parallel differential read-out configuration. The motor sensitivity provided to the first amplifier 422 and the second amplifier 424 is equal to the motor sensitivity of a single MEMS element (e.g., MS shown in FIG. 3). The output capacitance coupled to the first amplifier 422 and the second amplifier 424 is equal to two times the output capacitance of the single MEMS element.

One advantageous feature of the first read-out operating mode is the parallel differential read-out configuration provides moderate sensitivity and good leakage robustness.

Figure 5:
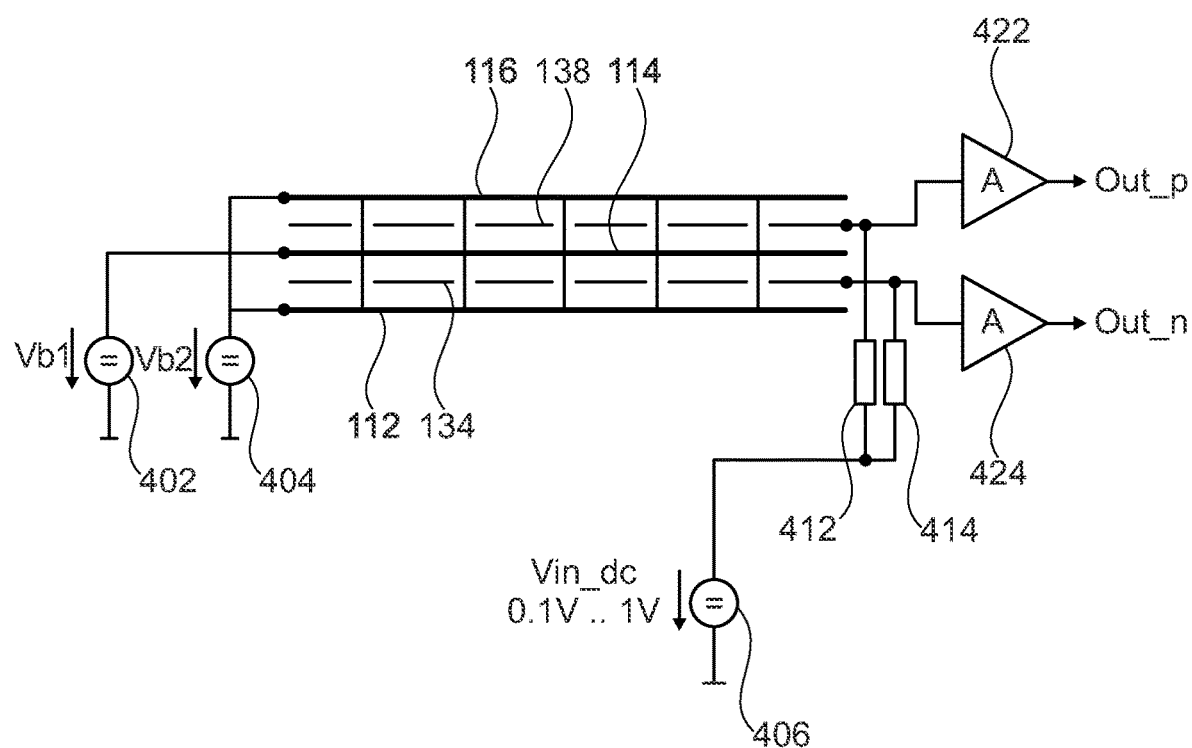
FIG. 5 illustrates another schematic diagram of the first read-out operating mode of the triple-membrane MEMS microphone in accordance with various embodiments of the present disclosure.

FIG. 5 illustrates another schematic diagram of the first read-out operating mode of the triple-membrane MEMS microphone in accordance with various embodiments of the present disclosure. The parallel differential read-out configuration shown in FIG. 5 is similar to that shown in FIG. 4 except that the first resistor 412 and the second resistor 414 are connected to a same voltage source Vin_dc. In some embodiments, the voltage of Vin_dc is in a range from about 0.1V to about 1 V. Furthermore, the first bias voltage source 402 and the second bias voltage source 404 are configured such that the bias circuit shown in FIG. 5 provides symmetric biasing. In particular, the output voltage of the first bias voltage source 402 can be expressed by the following equation:

$$Vb1 = Vb + Vin\_dc \quad (1)$$

The output voltage of the second bias voltage source 404 can be expressed by the following equation:

$$Vb2 = -(Vb - Vin\_dc) \quad (2)$$

According to Equations (1) and (2) above, the voltage of the membranes and the voltage of the stators satisfy the following equation:

$$|Vmembrane - Vstator| = Vb \quad (3)$$

In Equation (3), Vmembrance is the voltage of the membranes (e.g., first membrane 112). Vstator is the voltage of the stators (e.g., first stator 134).

It should be noted while FIG. 5 illustrates a symmetric biasing circuit, the various embodiments of the present disclosure may include an asymmetric biasing circuit. In particular, the asymmetric biasing circuit may be used to compensate the asymmetries of the triple-membrane MEMS microphone.

Figure 6:
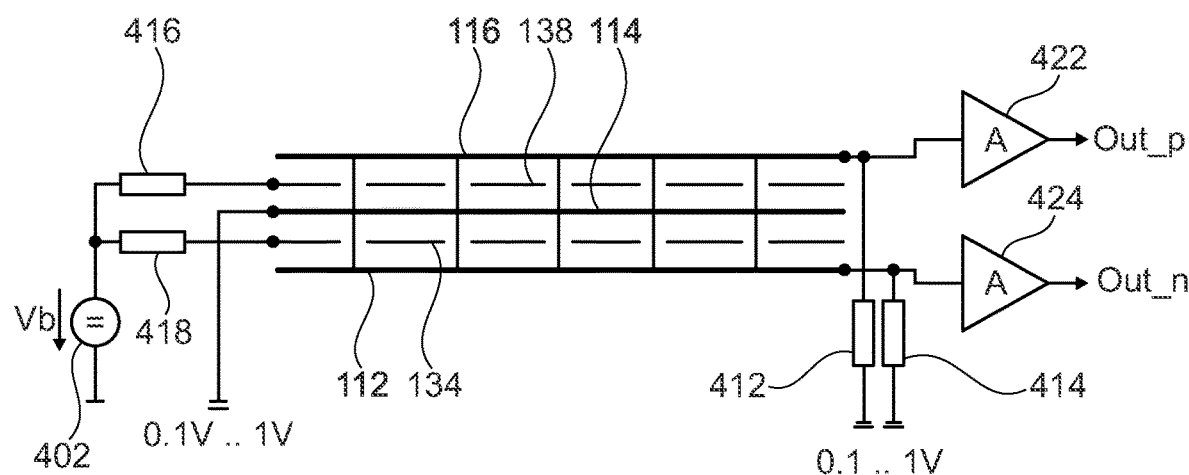
FIG. 6 illustrates a schematic diagram of a second read-out operating mode of the triple-membrane MEMS microphone in accordance with various embodiments of the present disclosure.

FIG. 6 illustrates a schematic diagram of a second read-out operating mode of the triple-membrane MEMS microphone in accordance with various embodiments of the present disclosure. As shown in FIG. 6, the signal processing circuit of the second read-out operating mode comprises a first bias voltage source 402, a first resistor 412, a second resistor 414, a third resistor 416, a fourth resistor 418, a first amplifier 422 and a second amplifier 424. The first bias voltage source 402 is a positive voltage source. In some embodiments, the output voltage of the first bias voltage source 402 is configured to produce a positive bias voltage in a range from about 5 V to about 15 V.

As shown in FIG. 6, the first bias voltage source 402 is configured to bias the first stator 134 and the second stator 138. More particularly, the first bias voltage source 402 is connected to the first stator 134 and the second stator 138 through the fourth resistor 418 and the third resistor 416, respectively. A predetermined voltage potential is configured to be coupled to the second membrane 114. The predetermined voltage potential is in a range from about 0.1V to about 1V.

The first amplifier 422 is connected to the third membrane 116. The first amplifier 422 is configured to read-out a positive output signal of the triple-membrane MEMS microphone. The second amplifier 424 is connected to the first membrane 112. The second amplifier 424 is configured to read-out a negative output signal of the triple-membrane MEMS microphone.

The first resistor 412 is coupled between the input of the first amplifier 422 and a first predetermined voltage potential. In some embodiments, the first resistor 412 is a 100 Giga-ohm resistor. In some embodiments, the first predetermined voltage potential may be any suitable voltage levels such as a voltage level in a range from about 0.1V to about 1V.

The second resistor 414 is coupled between the input of the second amplifier 424 and a second predetermined voltage potential. In some embodiments, the second resistor 414 is a 100 Giga-ohm resistor. The second predetermined voltage potential may be any suitable voltage levels such as a voltage level in a range from about 0.1V to about 1V.

The resistors 416 and 418 need to be sized such that the impedance is higher than the impedance of the MEMS capacitors at the lower frequency limit of the desired audio frequency band (e.g., 20 Hz). According to this selection principle, the value of the resistors 416 and 418 is greater than 10 Giga-ohm.

In the second read-out operating mode, the first capacitor and the second capacitor are configured to be connected in series. The third capacitor and the fourth capacitor are configured to be connected in series. The arrangement of the four capacitor forms a serial differential read-out configuration. The motor sensitivity provided to the first amplifier 422 and the second amplifier 424 is equal to two times the motor sensitivity of a single MEMS element. The output capacitance coupled to the first amplifier 422 and the second amplifier 424 is equal to one half of the output capacitance of a single MEMS element.

One advantageous feature of the second read-out operating mode is the series differential read-out configuration provides high sensitivity and moderate leakage robustness. The high sensitivity helps to lower the cost of the ASIC in which the signals generated by the triple-membrane MEMS microphone are processed.

Figure 7:
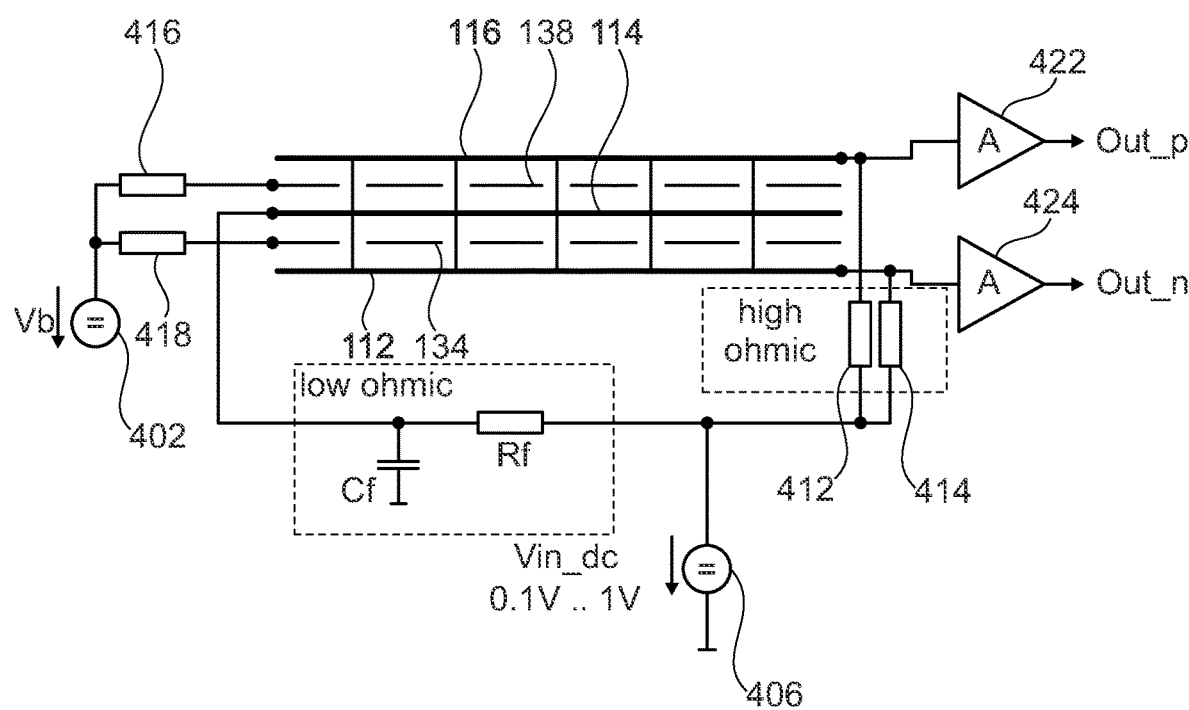
FIG. 7 illustrates another schematic diagram of the second read-out operating mode of the triple-membrane MEMS microphone in accordance with various embodiments of the present disclosure.

FIG. 7 illustrates another schematic diagram of the second read-out operating mode of the triple-membrane MEMS microphone in accordance with various embodiments of the present disclosure. The serial differential read-out configuration shown in FIG. 7 is similar to that shown in FIG. 6 except that the biasing of the second membrane 114 is derived from the input biasing of the ASIC in which the signals generated by the triple-membrane MEMS microphone are processed. A voltage source 406 is derived from the input biasing of the ASIC. Through a filter formed by Rf and Cf, the voltage Vin_dc of the voltage source 406 is applied to the second membrane 114. The effective bias voltage of the triple-membrane MEMS microphone is equal to the difference of Vb and Vin_dc.

In some embodiments, the filter capacitor Cf has a significantly larger value than the capacitance values (e.g., the capacitance values of the four capacitors) of the triple-membrane MEMS microphone.

In some embodiments, Rf is of a low resistance value so as to provide a low ohmic coupling between the voltage source 406 and the second membrane 114. On the other hand, the first resistor 412 and the second resistor 414 are of a high resistance value so as to provide a high ohmic coupling between the voltage source 406 and the inputs of the amplifiers 422 and 424.

Figure 8:
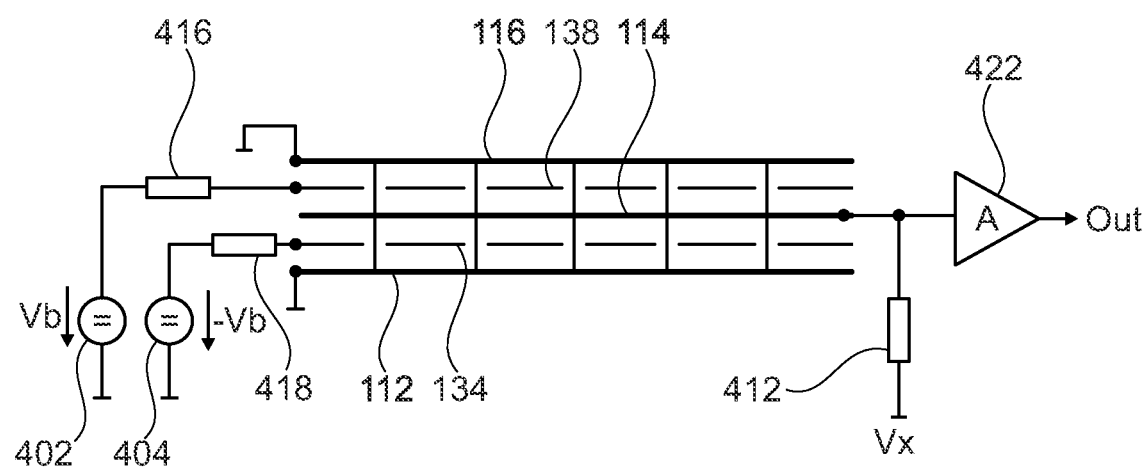
FIG. 8 illustrates a schematic diagram of a third read-out operating mode of the triple-membrane MEMS microphone in accordance with various embodiments of the present disclosure.

FIG. 8 illustrates a schematic diagram of a third read-out operating mode of the triple-membrane MEMS microphone in accordance with various embodiments of the present disclosure. As shown in FIG. 8, the signal processing circuit of the third read-out operating mode comprises a first bias voltage source 402, a second bias voltage source 404, a first resistor 412, a third resistor 416, a fourth resistor 418 and a first amplifier 422. The first bias voltage source 402 is a positive voltage source. In some embodiments, the output voltage of the first bias voltage source 402 is in a range from about 5 V to about 15 V. The second bias voltage source 404 is a negative voltage source. In some embodiments, the output voltage of the second bias voltage source 404 is in a range from about −5 V to about −15 V.

As shown in FIG. 8, the second bias voltage source 404 is configured to bias the first stator 134. More particularly, the second bias voltage source 404 is connected to the first stator 134 through the fourth resistor 418. The first bias voltage source 402 is configured to bias the second stator 138. More particularly, the first bias voltage source 402 is connected to the second stator 138 through the third resistor 416.

A predetermined voltage potential is configured to be coupled to the first membrane 112 and the third membrane 116. In some embodiments, the predetermined voltage potential is about zero. The first amplifier 422 is connected to the second membrane 114. The first amplifier 422 is configured to read-out an output signal of the triple-membrane MEMS microphone. The output signal OUT is a positive output signal.

The first resistor 412 is coupled between the input of the first amplifier 422 and a first predetermined voltage potential (Vx). In some embodiments, the first resistor 412 is a 100 Giga-ohm resistor. The first predetermined voltage potential is equal to zero. Alternatively, depending on different applications and design needs, the first predetermined voltage potential may be any suitable voltage levels such as a voltage level in a range from about 0.1V to about 1 V.

For achieving perfectly symmetric biasing conditions, the first membrane 112 and the third membrane 116 may be coupled to Vx. The output voltage level of the first bias voltage source 402 is configured to be equal to the sum of Vb and Vx. The output voltage level of the second bias voltage source 404 is configured to be equal to the sum of −Vb and Vx. The first membrane 112 and the third membrane 116 are coupled to Vx through an RC network (e.g., the RC network formed by Rf and Cf shown in FIG. 7).

In the third read-out operating mode, the first capacitor and the second capacitor are configured to be connected series. The third capacitor and the fourth capacitor are configured to be connected series. Furthermore, the series-connected first capacitor and the second capacitor are configured to be connected in parallel with the series-connected third capacitor and the fourth capacitor.

The arrangement of the four capacitor forms a serial/parallel single ended read-out configuration. The motor sensitivity provided to the first amplifier 422 is equal to two times the motor sensitivity of a single MEMS element. The output capacitance coupled to the first amplifier 422 is equal to the output capacitance of a single MEMS element.

One advantageous feature of the third read-out operating mode is the serial/parallel single ended read-out configuration provides high sensitivity and good leakage robustness. Furthermore, the serial/parallel single ended read-out configuration simplifies the circuit connection, thereby reducing the cost of the triple-membrane MEMS microphone.

Figure 9:
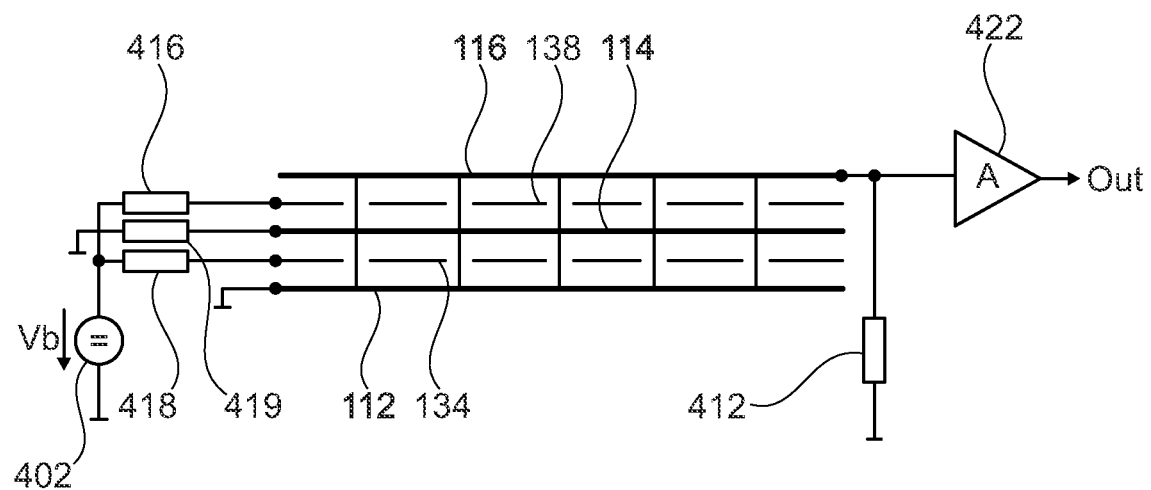
FIG. 9 illustrates a schematic diagram of a fourth read-out operating mode of the triple-membrane MEMS microphone in accordance with various embodiments of the present disclosure.

FIG. 9 illustrates a schematic diagram of a fourth read-out operating mode of the triple-membrane MEMS microphone in accordance with various embodiments of the present disclosure. As shown in FIG. 9, the signal processing circuit of the fourth read-out operating mode comprises a first bias voltage source 402, a first resistor 412, a third resistor 416, a fourth resistor 418, a fifth resistor 419 and a first amplifier 422. The first bias voltage source 402 is a positive voltage source. In some embodiments, the output voltage of the first bias voltage source 402 is in a range from about 5 V to about 15 V.

The first bias voltage source 402 is configured to bias the first stator 134 and the second stator 138 through the fourth resistor 418 and the third resistor 416, respectively. A predetermined voltage potential is configured to be coupled to the first membrane 112 and the second membrane 114. More particularly, the predetermined voltage potential is connected to the first membrane 112 directly and the second membrane 114 through the fifth resistor 419.

The first amplifier 422 is connected to the third membrane 116. The first amplifier 422 is configured to read-out an output signal of the triple-membrane MEMS microphone. The output signal OUT is a positive output signal. The connection of the first resistor 412 is similar to that shown in FIG. 8, and hence is not discussed again herein.

In the fourth read-out operating mode, the first capacitor, the second capacitor, the third capacitor and the fourth capacitor are configured to be connected in series. The arrangement of the four capacitor forms a serial single ended read-out configuration. The motor sensitivity provided to the first amplifier 422 is equal to four times the motor sensitivity of a single MEMS element. The output capacitance coupled to the first amplifier 422 is equal to one fourth of the output capacitance of a single MEMS element.

One advantageous feature of the fourth read-out operating mode is the serial single ended read-out configuration provides high sensitivity. Furthermore, the serial single ended read-out configuration simplifies the circuit connection, thereby reducing the cost of the triple-membrane MEMS microphone.

Figure 10:
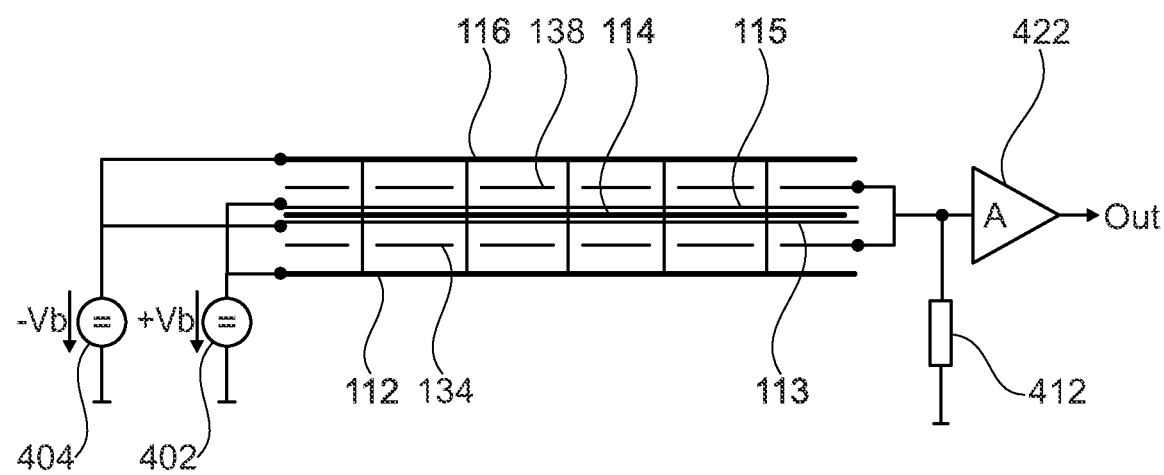
FIG. 10 illustrates a schematic diagram of a fifth read-out operating mode of the triple-membrane MEMS microphone in accordance with various embodiments of the present disclosure.

FIG. 10 illustrates a schematic diagram of a fifth read-out operating mode of the triple-membrane MEMS microphone in accordance with various embodiments of the present disclosure. As shown in FIG. 10, the signal processing circuit of the fifth read-out operating mode comprises a first bias voltage source 402, a second bias voltage source 404, a first resistor 412 and a first amplifier 422. The first bias voltage source 402 is a positive voltage source. In some embodiments, the output voltage of the first bias voltage source 402 is in a range from about 5 V to about 15 V. The second bias voltage source 404 is a negative voltage source. In some embodiments, the output voltage of the second bias voltage source 404 is in a range from about −5 V to about −15 V.

In the fifth read-out operating mode, the first bias voltage source 402 is configured to bias the first membrane 112 and a top electrode layer 115 of the second membrane with 114. The second bias voltage source 404 is configured to bias the third membrane 116 and a bottom electrode layer 113 of the second membrane 114.

The first amplifier 422 is connected to the first stator 134 and the second stator 138. The first amplifier 422 is configured to read-out an output signal of the triple-membrane MEMS microphone. The output signal OUT is a positive output signal. The connection of the first resistor 412 is similar to that shown in FIG. 8, and hence is not discussed again herein.

In the fifth read-out operating mode, the first capacitor, the second capacitor, the third capacitor and the fourth capacitor are configured to be connected in parallel. The arrangement of the four capacitor forms a parallel single ended read-out configuration. The motor sensitivity provided to the first amplifier 422 is equal to the motor sensitivity of a single MEMS element. The output capacitance coupled to the first amplifier 422 is equal to four times the output capacitance of a single MEMS element.

One advantageous feature of the fifth read-out operating mode is the parallel single ended read-out configuration provides good leakage robustness. Furthermore, the parallel single ended read-out configuration simplifies the circuit connection, thereby reducing the cost of the triple-membrane MEMS microphone.

Figure 11:
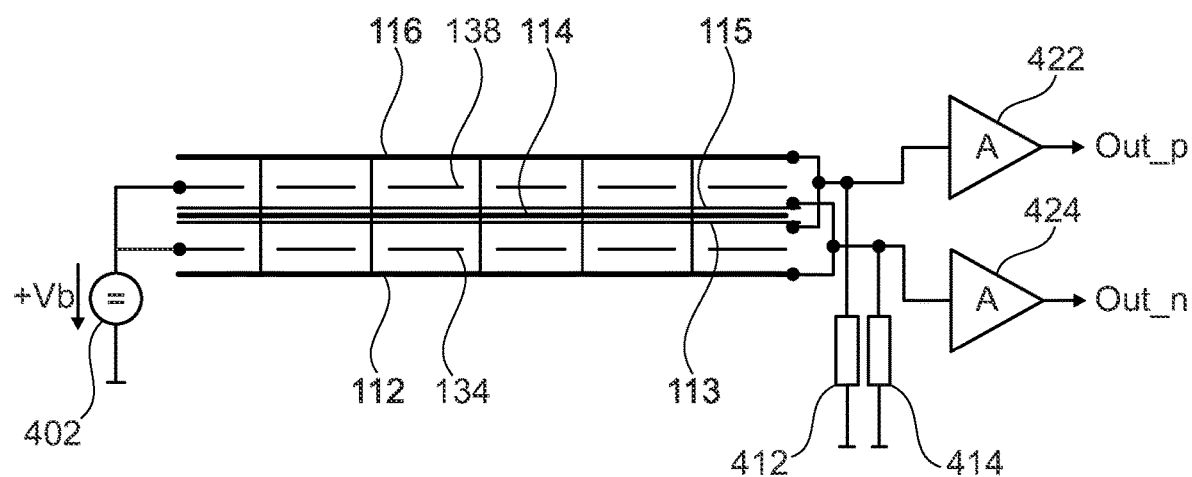
FIG. 11 illustrates a schematic diagram of a sixth read-out operating mode of the triple-membrane MEMS microphone in accordance with various embodiments of the present disclosure.

FIG. 11 illustrates a schematic diagram of a sixth read-out operating mode of the triple-membrane MEMS microphone in accordance with various embodiments of the present disclosure. As shown in FIG. 11, the signal processing circuit of the sixth read-out operating mode comprises a first bias voltage source 402, a first resistor 412, a second resistor 414, a first amplifier 422 and a second amplifier 424. The first bias voltage source 402 is a positive voltage source. In some embodiments, the output voltage of the first bias voltage source 402 is in a range from about 5 V to about 15 V. The first bias voltage source 402 is configured to bias the first stator 134 and the second stator 138.

In the sixth read-out operating mode, the third membrane 116 and a bottom electrode layer 113 of the second membrane 114 are connected together and further connected to an input of the first amplifier 422. The first amplifier 422 is configured to read-out a positive output signal of the triple-membrane MEMS microphone. The first membrane 112 and a top electrode layer 115 of the second membrane 114 are connected together and further connected to an input of the second amplifier 424. The second amplifier 424 is configured to read-out a negative output signal of the triple-membrane MEMS microphone. The connection of the first resistor 412 and the second resistor 414 is similar to that shown in FIG. 4, and hence is not discussed again herein.

In the sixth read-out operating mode, the first capacitor and the third capacitor are configured to be connected in parallel and from a first read-out electrode. The second capacitor and the fourth capacitor are configured to be connected in parallel and form a second read-out electrode.

The arrangement of the four capacitor forms a parallel differential read-out configuration. The motor sensitivity provided to the first amplifier 422 and the second amplifier 424 is equal to the motor sensitivity of a single MEMS element. The output capacitance coupled to the first amplifier 422 and the second amplifier 424 is equal to four times the output capacitance of a single MEMS element.

One advantageous feature of the sixth read-out operating mode is the parallel differential read-out configuration helps to reduce the number of bond wires used for the triple-membrane MEMS microphone, thereby reducing the cost of the triple-membrane MEMS microphone.

Figure 12:
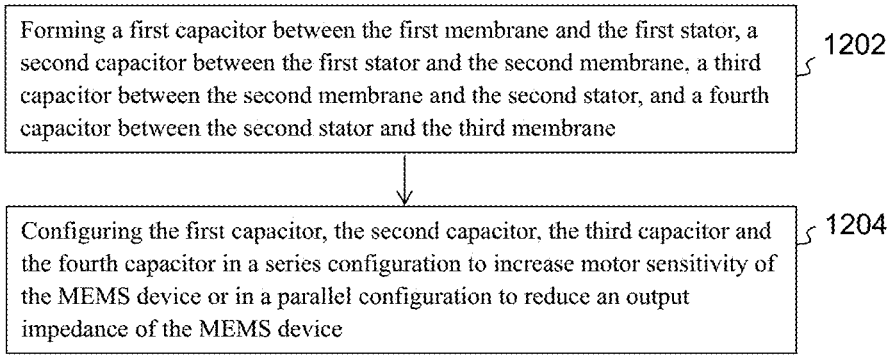
FIG. 12 illustrates a flow chart of a method of reading-out the triple-membrane MEMS microphone shown in FIG. 2 in accordance with various embodiments of the present disclosure.

FIG. 12 illustrates a flow chart of a method of reading-out the triple-membrane MEMS microphone shown in FIG. 2 in accordance with various embodiments of the present disclosure. This flowchart shown in FIG. 12 is merely an example, which should not unduly limit the scope of the claims. One of ordinary skill in the art would recognize many variations, alternatives, and modifications. For example, various steps illustrated in FIG. 12 may be added, removed, replaced, rearranged and repeated.

An MEMS device comprises a first membrane, a second membrane and a third membrane spaced apart from one another. The second membrane is between the first membrane and the third membrane. The MEMS device further comprises a first stator between the first membrane and a second membrane, and a second stator between a second membrane and a third membrane.

At step 1202, a first capacitor is formed between the first membrane and the first stator. A second capacitor is formed between the first stator and the second membrane. A third capacitor is formed between the second membrane and the second stator. A fourth capacitor is formed between the second stator and the third membrane.

At step 1204, the first capacitor, the second capacitor, the third capacitor and the fourth capacitor are configured to be connected in a series to increase motor sensitivity of the MEMS device. Alternatively, the first capacitor, the second capacitor, the third capacitor and the fourth capacitor are configured to be connected in a parallel to reduce an output impedance of the MEMS device.

Embodiments of the present invention are summarized here. Other embodiments can also be understood from the entirety of the specification and the claims filed herein.

Example 1

A method of reading-out a microelectromechanical system (MEMS) device, the MEMS device comprising a first membrane, a second membrane and a third membrane spaced apart from one another, the second membrane being between the first membrane and the third membrane, a first stator between the first membrane and a second membrane, and a second stator between a second membrane and a third membrane, the method comprising: forming a first capacitor between the first membrane and the first stator, a second capacitor between the first stator and the second membrane, a third capacitor between the second membrane and the second stator, and a fourth capacitor between the second stator and the third membrane, and configuring the first capacitor, the second capacitor, the third capacitor and the fourth capacitor in a series configuration to increase motor sensitivity of the MEMS device or in a parallel configuration to reduce an output impedance of the MEMS device.

Example 2

The method of example 1, further comprising: in a first read-out operating mode, biasing the first membrane and the third membrane with a first voltage source, biasing the second membrane with a second voltage source, reading-out a positive output signal through a first amplifier connected to the second stator, and reading-out a negative output signal through a second amplifier connected to the first stator.

Example 3

The method of example 2, where the first voltage source is configured to produce a negative bias voltage, and the second voltage source is configured to produce a positive bias voltage.

Example 4

The method of one of examples 2 and 3, where in the first read-out operating mode, the first capacitor and the second capacitor are configured to be connected in parallel, and the third capacitor and the fourth capacitor are configured to be connected in parallel through the first voltage source and the second voltage source.

Example 5

The method of example 1, further comprising: in a second read-out operating mode, biasing a first stator and a second stator with a voltage source, coupling the second membrane to a predetermined voltage potential, reading-out a positive output signal through a first amplifier connected to the third membrane, and reading-out a negative output signal through a second amplifier connected to the first membrane.

Example 6

The method of example 5, where the voltage source is configured to produce a positive bias voltage, and the predetermined voltage potential is in a range from about 0.1V to about 1V.

Example 7

The method of one of examples 5 and 6, where in the second read-out operating mode, the first capacitor and the second capacitor are configured to be connected in series, and the third capacitor and the fourth capacitor are configured to be connected in series.

Example 8

The method of example 1, further comprising: in a third read-out operating mode, biasing a first stator with a first voltage source, biasing a second stator with a second voltage source, coupling the first membrane and the third membrane to a predetermined voltage potential, and reading-out an output signal through an amplifier connected to the second membrane.

Example 9

The method of example 8, where the first voltage source is configured to produce a negative bias voltage, and the second voltage source is configured to produce a positive bias voltage.

Example 10

The method of one of examples 8 and 9, where in the third read-out operating mode, the first capacitor and the second capacitor are configured to be connected series, and the third capacitor and the fourth capacitor are configured to be connected series, and wherein the series-connected first capacitor and the second capacitor are configured to be connected in parallel with the series-connected third capacitor and the fourth capacitor.

Example 11

The method of example 1, further comprising: in a fourth read-out operating mode, biasing the first stator and the second stator with a voltage source, coupling the first membrane and the second membrane to a predetermined voltage potential, and reading-out an output signal through an amplifier connected to the third membrane.

Example 12

The method of example 11, where in the fourth read-out operating mode, the first capacitor, the second capacitor the third capacitor and the fourth capacitor are configured to be connected in series.

Example 13

The method of example 1, further comprising: in a fifth read-out operating mode, biasing the first membrane and a top electrode layer of the second membrane with a first voltage source, biasing the third membrane and a bottom electrode layer of the second membrane with a second voltage source, and reading-out an output signal through an amplifier connected to the first stator and the second stator.

Example 14

The method of example 13, where in the fifth read-out operating mode, the first capacitor, the second capacitor the third capacitor and the fourth capacitor are configured to be connected in parallel.

Example 15

The method of example 1, further comprising: in a sixth read-out operating mode, biasing the first stator and the second stator with a voltage source, reading-out a positive output signal through a first amplifier connected to the third membrane and a bottom electrode layer of the second membrane, and reading-out a negative output signal through a second amplifier connected to the first membrane and a top electrode layer of the second membrane.

Example 16

The method of example 15, where in the sixth read-out operating mode, the first capacitor and the third capacitor are configured to be connected in parallel and from a first read-out electrode, and the second capacitor and the fourth capacitor are configured to be connected in parallel and form a second read-out electrode.

Example 17

A triple-membrane MEMS device comprising: a first membrane, a second membrane and a third membrane spaced apart from one another, wherein the second membrane is between the first membrane and the third membrane, a sealed low pressure chamber between the first membrane and the third membrane, a first stator and a second stator in the sealed low pressure chamber, and a signal processing circuit configured to read-out output signals of the triple-membrane MEMS device.

Example 18

The triple-membrane MEMS device of example 17, where the signal processing circuit comprises a negative voltage source configured to bias the first membrane and the third membrane, a positive voltage source configured to bias the second membrane, a first amplifier connected to the second stator and configured to read-out a positive output signal of the triple-membrane MEMS device, and a second amplifier connected to the first stator and configured to read-out a negative output signal of the triple-membrane MEMS device.

Example 19

The triple-membrane MEMS device of example 17, where the signal processing circuit comprises a voltage source configured to bias the first stator and the second stator, a predetermined voltage potential configured to be coupled to the second membrane, a first amplifier connected to the third membrane and configured to read-out a positive output signal of the triple-membrane MEMS device, and a second amplifier connected to the first membrane and configured to read-out a negative output signal of the triple-membrane MEMS device.

Example 20

The triple-membrane MEMS device of example 17, where the signal processing circuit comprises a negative voltage source configured to bias the first stator, a positive voltage source configured to bias the second stator, a predetermined voltage potential configured to be coupled to the first membrane and the third membrane, and an amplifier connected to the second membrane and configured to read-out an output signal of the triple-membrane MEMS device.

Example 21

The triple-membrane MEMS device of example 17, where the signal processing circuit comprises a voltage source configured to bias the first stator and the second stator, a predetermined voltage potential configured to be coupled to the first membrane and the second membrane, and an amplifier connected to the third membrane and configured to read-out an output signal of the triple-membrane MEMS device.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of reading-out a microelectromechanical system (MEMS) device, the MEMS device comprising a first membrane, a second membrane and a third membrane spaced apart from one another, the second membrane being between the first membrane and the third membrane, a first stator between the first membrane and the second membrane, and a second stator between the second membrane and the third membrane, the method comprising:
forming a first capacitor between the first membrane and the first stator, a second capacitor between the first stator and the second membrane, a third capacitor between the second membrane and the second stator, and a fourth capacitor between the second stator and the third membrane, wherein a sealed low pressure chamber is between the first membrane the third membrane;
configuring the first capacitor, the second capacitor, the third capacitor and the fourth capacitor in a series configuration to increase motor sensitivity of the MEMS device or in a parallel configuration to reduce an output impedance of the MEMS device; and
in a third read-out operating mode,
biasing the first stator with a first voltage source,
biasing the second stator with a second voltage source,
coupling the first membrane and the third membrane to a predetermined voltage potential, and
reading-out an output signal through an amplifier connected to the second membrane.

2. The method of claim 1, further comprising, in a first read-out operating mode:
biasing the first membrane and the third membrane with the first voltage source;
biasing the second membrane with the second voltage source;
reading-out a positive output signal through a first amplifier connected to the second stator; and
reading-out a negative output signal through a second amplifier connected to the first stator.

3. The method of claim 2, wherein:
the first voltage source is configured to produce a negative bias voltage; and
the second voltage source is configured to produce a positive bias voltage.

4. The method of claim 2, wherein:
in the first read-out operating mode, the first capacitor and the second capacitor are configured to be connected in parallel, and the third capacitor and the fourth capacitor are configured to be connected in parallel through the first voltage source and the second voltage source.

5. The method of claim 1, further comprising, in a second read-out operating mode:
biasing the first stator and the second stator with a voltage source;
coupling the second membrane to the predetermined voltage potential;
reading-out a positive output signal through a first amplifier connected to the third membrane; and
reading-out a negative output signal through a second amplifier connected to the first membrane.

6. The method of claim 5, wherein:
the voltage source is configured to produce a positive bias voltage; and
the predetermined voltage potential is in a range from about 0.1V to about 1V.

7. The method of claim 5, wherein:
in the second read-out operating mode, the first capacitor and the second capacitor are configured to be connected in series; and
the third capacitor and the fourth capacitor are configured to be connected in series.

8. The method of claim 1, wherein:
the first voltage source is configured to produce a negative bias voltage; and
the second voltage source is configured to produce a positive bias voltage.

9. The method of claim 1, wherein:
in the third read-out operating mode, the first capacitor and the second capacitor are configured to be connected series; and
the third capacitor and the fourth capacitor are configured to be connected series, and wherein the series-connected first capacitor and the second capacitor are configured to be connected in parallel with the series-connected third capacitor and the fourth capacitor.

10. A method of reading-out a microelectromechanical system (MEMS) device, the MEMS device comprising a first membrane, a second membrane and a third membrane spaced apart from one another, the second membrane being between the first membrane and the third membrane, a first stator between the first membrane and the second membrane, and a second stator between the second membrane and the third membrane, the method comprising:
forming a first capacitor between the first membrane and the first stator, a second capacitor between the first stator and the second membrane, a third capacitor between the second membrane and the second stator, and a fourth capacitor between the second stator and the third membrane, wherein a sealed low pressure chamber is between the first membrane the third membrane;
configuring the first capacitor, the second capacitor, the third capacitor and the fourth capacitor in a series configuration to increase motor sensitivity of the MEMS device or in a parallel configuration to reduce an output impedance of the MEMS device; and
in a fourth read-out operating mode,
biasing the first stator and the second stator with a voltage source,
coupling the first membrane and the second membrane to a predetermined voltage potential, and
reading-out an output signal through an amplifier connected to the third membrane.

11. The method of claim 10, wherein:
in the fourth read-out operating mode, the first capacitor, the second capacitor the third capacitor and the fourth capacitor are configured to be connected in series.

12. A method of reading-out a microelectromechanical system (MEMS) device, the MEMS device comprising a first membrane, a second membrane and a third membrane spaced apart from one another, the second membrane being between the first membrane and the third membrane, a first stator between the first membrane and the second membrane, and a second stator between the second membrane and the third membrane, the method comprising:
forming a first capacitor between the first membrane and the first stator, a second capacitor between the first stator and the second membrane, a third capacitor between the second membrane and the second stator, and a fourth capacitor between the second stator and the third membrane, wherein a sealed low pressure chamber is between the first membrane the third membrane;
configuring the first capacitor, the second capacitor, the third capacitor and the fourth capacitor in a series configuration to increase motor sensitivity of the MEMS device or in a parallel configuration to reduce an output impedance of the MEMS device; and
in a fifth read-out operating mode,
biasing the first membrane and a top electrode layer of the second membrane with a first voltage source,
biasing the third membrane and a bottom electrode layer of the second membrane with a second voltage source, and
reading-out an output signal through an amplifier connected to the first stator and the second stator.

13. The method of claim 12, wherein:
in the fifth read-out operating mode, the first capacitor, the second capacitor the third capacitor and the fourth capacitor are configured to be connected in parallel.

14. A method of reading-out a microelectromechanical system (MEMS) device, the MEMS device comprising a first membrane, a second membrane and a third membrane spaced apart from one another, the second membrane being between the first membrane and the third membrane, a first stator between the first membrane and the second membrane, and a second stator between the second membrane and the third membrane, the method comprising:
forming a first capacitor between the first membrane and the first stator, a second capacitor between the first stator and the second membrane, a third capacitor between the second membrane and the second stator, and a fourth capacitor between the second stator and the third membrane, wherein a sealed low pressure chamber is between the first membrane the third membrane;
configuring the first capacitor, the second capacitor, the third capacitor and the fourth capacitor in a series configuration to increase motor sensitivity of the MEMS device or in a parallel configuration to reduce an output impedance of the MEMS device; and
in a sixth read-out operating mode,
biasing the first stator and the second stator with a voltage source,
reading-out a positive output signal through a first amplifier connected to the third membrane and a bottom electrode layer of the second membrane, and
reading-out a negative output signal through a second amplifier connected to the first membrane and a top electrode layer of the second membrane.

15. The method of claim 14, wherein:
in the sixth read-out operating mode, the first capacitor and the third capacitor are configured to be connected in parallel and form a first read-out electrode, and the second capacitor and the fourth capacitor are configured to be connected in parallel and form a second read-out electrode.

16. A triple-membrane MEMS device comprising:
a first membrane, a second membrane and a third membrane spaced apart from one another, wherein the second membrane is between the first membrane and the third membrane;
a sealed low pressure chamber between the first membrane and the third membrane;
a first stator and a second stator in the sealed low pressure chamber; and
a signal processing circuit configured to read-out output signals of the triple-membrane MEMS device, the signal processing circuit comprising:
a voltage source configured to bias the first stator and the second stator,
a predetermined voltage potential configured to be coupled to the first membrane and the second membrane, and an amplifier connected to the third membrane and configured to read-out an output signal of the triple-membrane MEMS device.

17. A triple-membrane MEMS device comprising:
a first membrane, a second membrane and a third membrane spaced apart from one another, wherein the second membrane is between the first membrane and the third membrane;
a sealed low pressure chamber between the first membrane and the third membrane;
a first stator and a second stator in the sealed low pressure chamber; and
a signal processing circuit configured to read-out output signals of the triple-membrane MEMS device, wherein the signal processing circuit comprises:
  a negative voltage source configured to bias the first stator,
  a positive voltage source configured to bias the second stator
  a predetermined voltage potential configured to be coupled to the first membrane and the third membrane, and
  an amplifier connected to the second membrane and configured to read-out an output signal of the triple-membrane MEMS device.

* * * * *